(12) United States Patent
Liang

(10) Patent No.: US 9,046,722 B2
(45) Date of Patent: Jun. 2, 2015

(54) METHOD OF FABRICATING IN-PLANE SWITCHING (IPS) SCREEN ELECTRODE

(71) Applicant: Shanghai AVIC Optoelectronics Co., Ltd., Shanghai (CN)

(72) Inventor: Yanfeng Liang, Shanghai (CN)

(73) Assignee: Shanghai AVIC Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 14/069,279

(22) Filed: Oct. 31, 2013

(65) Prior Publication Data

US 2014/0076843 A1    Mar. 20, 2014

Related U.S. Application Data

(63) Continuation of application No. PCT/CN2012/084960, filed on Nov. 21, 2012.

(30) Foreign Application Priority Data

Sep. 20, 2012   (CN) .......................... 2012 1 0353106

(51) Int. Cl.
| | |
|---|---|
| *B44C 1/22* | (2006.01) |
| *G02F 1/1343* | (2006.01) |
| *H01L 21/02* | (2006.01) |
| *B81C 1/00* | (2006.01) |
| *H01L 31/18* | (2006.01) |
| *G02F 1/1335* | (2006.01) |
| *G02F 1/1333* | (2006.01) |

(52) U.S. Cl.
CPC ...... *G02F 1/13439* (2013.01); *G02F 1/134363* (2013.01); *H01L 21/02052* (2013.01); *B81C 1/00539* (2013.01); *H01L 31/1884* (2013.01); *G02F 1/133516* (2013.01); *G02F 2201/123* (2013.01); *G02F 1/1333* (2013.01)

(58) Field of Classification Search
CPC ................... B81C 1/00539; B81C 2201/0133; G02F 1/134363; G02F 1/133516; H01L 21/02052; H01L 31/1884
See application file for complete search history.

(56) References Cited

U.S. PATENT DOCUMENTS

| | | | |
|---|---|---|---|
| 5,168,074 A | | 12/1992 | Sarma |
| 6,448,158 B2 | | 9/2002 | Peng et al. |
| 8,093,110 B2 | | 1/2012 | Liu |
| 2004/0119915 A1 | * | 6/2004 | Kim .............................. 349/110 |
| 2011/0025961 A1 | * | 2/2011 | Ochiai et al. .................. 349/114 |

FOREIGN PATENT DOCUMENTS

| | | |
|---|---|---|
| CN | 1991549 A | 7/2007 |
| CN | 102540603 A | 7/2012 |

* cited by examiner

*Primary Examiner* — Lan Vinh
*Assistant Examiner* — Jiong-Ping Lu
(74) *Attorney, Agent, or Firm* — Kilpatrick Townsend & Stockton LLP

(57) ABSTRACT

A method of fabricating an In-Plane Switching (IPS) screen electrode is disclosed. In the method, a first ITO layer is etched, and the etched first ITO layer is annealed. Subsequently, a second ITO layer is etched, and the etched first ITO layer and the etched second ITO layer are concurrently annealed. With this method, the etched first ITO layer is annealed after the first ITO layer is etched, subsequent etching of the second ITO layer will have no influence upon the annealed first ITO layer, thus making it possible to ensure the line widths of the two ITO layers and a spacing between the respective ITO layers to thereby effectively avoid the problem of a short circuit due to a too small spacing between the respective ITO layers.

13 Claims, 5 Drawing Sheets

METHOD OF FABRICATING IN-PLANE SWITCHING (IPS) SCREEN ELECTRODE

CROSS-REFERENCES TO RELATED APPLICATIONS

This application claims priority to and is a continuation of PCT/CN2012/084960, filed on Nov. 21, 2012 and entitled "METHOD OF FABRICATING IN-PLANE SWITCHING (IPS) SCREEN ELECTRODE", which application claims the benefit of Chinese Patent Application No. 201210353106.0, filed with the Chinese Patent Office on Sep. 20, 2012 and entitled "METHOD OF FABRICATING IN-PLANE SWITCHING (IPS) SCREEN ELECTRODE", the contents of which are incorporated herein by reference in their entirety.

FIELD

The present invention relates to the field of displays and particularly to a method of fabricating In-Plane Switching (IPS) screen electrode.

BACKGROUND OF THE INVENTION

The technology of In-Plane Switching (IPS) is a liquid crystal panel technology proposed by Hitachi in 2001. An IPS screen fabricated with this technology is predominantly characterized in that two electrodes are in the same plane and the alignment of liquid crystal molecules is optimized so that they are aligned horizontally. Being under an external pressure, the molecules are structurally depressed downward slightly but still generally appear horizontal without a distortion of an image and without degrading a picture in color. Due to the foregoing advantages, the IPS screen plays a role of increasing importance in the field of displays.

IPS screen electrodes include two Indium Tin Oxide (ITO) layers, which are a pixel ITO layer and a common ITO layer respectively. In fabrication of the IPS screen electrodes in the prior art, the pixel ITO layer and the common ITO layer are typically fabricated concurrently in order to ensure the consistency of transmittance, resistivity and other important parameters between the pixel ITO layer and the common ITO layer. However due to the resolution of an exposure machine, concurrent fabrication of both the ITO layers may result in a lowered spacing between the respective ITO layers, which in turn may easily have the ITO layers electrically connected causing a short circuit, and the performance of the product may be lowered if the spacing between the respective ITO layers is ensured by reducing the line widths of the ITO layers.

BRIEF SUMMARY OF THE INVENTION

One inventive aspect is a method of fabricating an In-Plane Switching (IPS) screen electrode. The method includes etching a first Indium Tin Oxide (ITO) layer using oxalic acid, and annealing the etched first ITO layer for a first preset length of time at a preset temperature. The method also includes etching a second ITO layer using oxalic acid, and annealing the etched first ITO layer and the etched second ITO layer for a second preset length of time at the preset temperature.

DETAILED DESCRIPTION OF THE INVENTION

Embodiments of the invention will be described below clearly with reference to the drawings in the embodiments of the invention. The described embodiments are only a part but not all of the embodiments of the invention. Based upon the embodiments of the invention herein, all of other embodiments derived by those ordinarily skilled in the art shall come into the scope of the invention.

Figure 1:
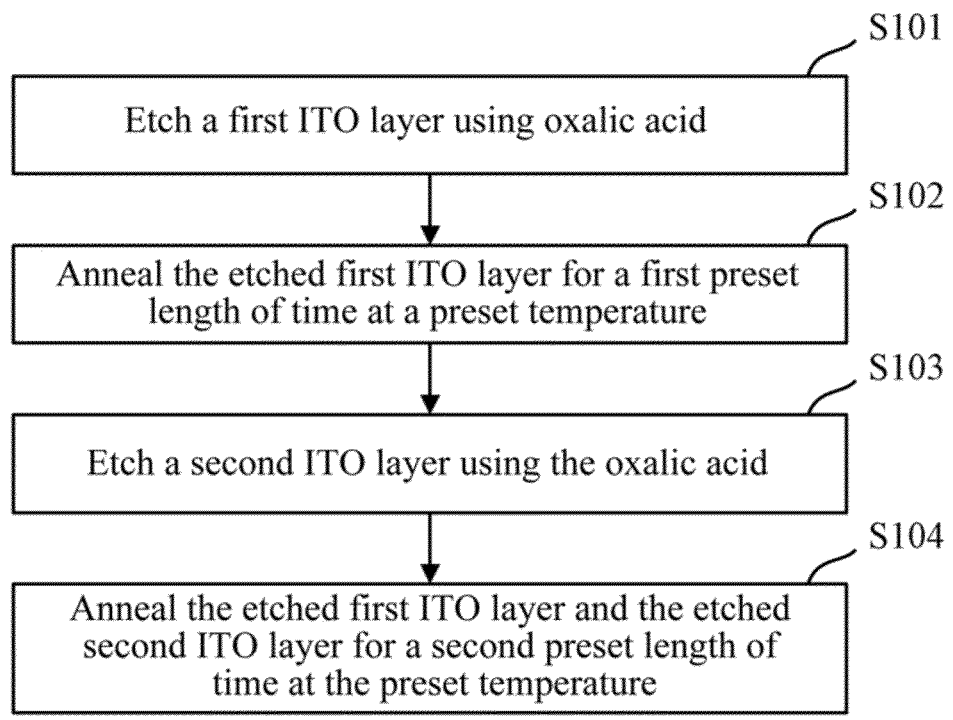
FIG. 1 is a flowchart of a process of fabricating an IPS screen electrode according to an embodiment of the invention.

FIG. 1 is a flowchart of a process of fabricating an IPS screen electrode according to an embodiment of the invention, the process particularly including the following steps:

S101: etching a first ITO layer using oxalic acid.

In the embodiment of the invention, firstly the first ITO layer may be exposed and developed to define a shape into which the first ITO layer is to be etched, and then the first ITO layer may be etched. Specifically after the first ITO layer is exposed and developed, the exposed part thereof is the part to be etched away using oxalic acid, and the unexposed part is the part to remain, so after the first ITO layer is exposed and developed, the exposed part after being exposed and developed can be etched using oxalic acid.

S102: annealing the etched first ITO layer for a first preset length of time at a preset temperature.

After the first ITO layer is etched, the etched first ITO layer is annealed at the preset temperature and for the first preset length of time, which is referred to first annealing.

S103: etching a second ITO layer using oxalic acid.

Similarly after the etched first ITO layer is annealed, then the second ITO layer is exposed and developed to define a shape into which the second ITO layer is to be etched, and then the second ITO layer is etched using oxalic acid. A difference is that when the second ITO layer is etched, the part to be etched using oxalic acid may further include the part of the annealed first ITO layer in addition to the exposed part of the second ITO layer, and since the first annealing has been performed on the etched first ITO layer, the annealed first ITO layer will not be etched away.

S104: annealing the etched first ITO layer and the etched second ITO layer for a second preset length of time at the preset temperature.

In the embodiment of the invention, after the second ITO layer is etched, the etched first ITO layer and the etched second ITO layer are annealed concurrently for the second preset length of time at the same preset temperature as in the first annealing, which is referred to second annealing.

In order to ensure the consistency of important parameters (e.g., resistivity, transmittance, etc.) between the annealed first ITO layer and the annealed second ITO layer, the preset temperature adopted for the first annealing and the second annealing may be controlled from 150° C. to 280° C. Moreover since annealing is performed on the first ITO layer twice (the first annealing and the second annealing as referred to above), and a total length of time of both annealing is the sum of the first preset length of time and the second preset length of time, while annealing is performed only once on the second ITO layer for the second preset length of time (the second annealing as referred to above), in order to ensure the consistency of the important parameters between the annealed first ITO layer and the annealed second ITO layer, the foregoing sum of the first preset length of time and the second preset length of time may be controlled not to exceed 4 hours.

With the foregoing method, since the first annealing has been performed on the etched first ITO layer before the second ITO layer is etched, oxalic acid will have no influence upon the annealed first ITO layer when the second ITO layer is etched, so that the two ITO layers of the IPS screen electrodes are fabricated in separate steps, making it possible to ensure the line widths of the two ITO layers and a spacing between the two ITO layers to thereby effectively avoid the problem of a short circuit due to a too small spacing between the two ITO layers. Moreover when the two ITO layers are fabricated with the foregoing method, the two ITO layers are annealed at the same temperature, and also the two ITO layers are annealed for the approximate lengths of time, so the consistency of important parameters (e.g., resistivity, transmittance, etc.) between the two ITO layers can be ensured. An experiment showed when the two ITO layers are fabricated with the foregoing method, if the temperature of both annealing is controlled from 150° C. to 280° C., and the total length of time of both annealing (the sum of the first present length of time and the second present length of time) does not exceeds 4 hours, then the important parameters of the two fabricated ITO layers will differ from each other by no more than 5%.

In the foregoing process, the first ITO layer can be a pixel ITO layer, and the second ITO layer can be a common ITO layer. Alternatively the first ITO layer can be a common ITO layer, and the second ITO layer can be a pixel ITO layer.

Moreover in order to ensure the two fabricated ITO layers to satisfy the existing standard of IPS screen electrodes, both the first ITO layer and the second ITO layer are etched to 4 micrometers (μm) in line width, and there is a spacing of 3 micrometers (μm) between the etched first ITO layer and the etched second ITO layer.

The foregoing process will be detailed below by way of an example where the first ITO layer is a common ITO layer and the second ITO layer is a pixel ITO layer.

Figure 2:
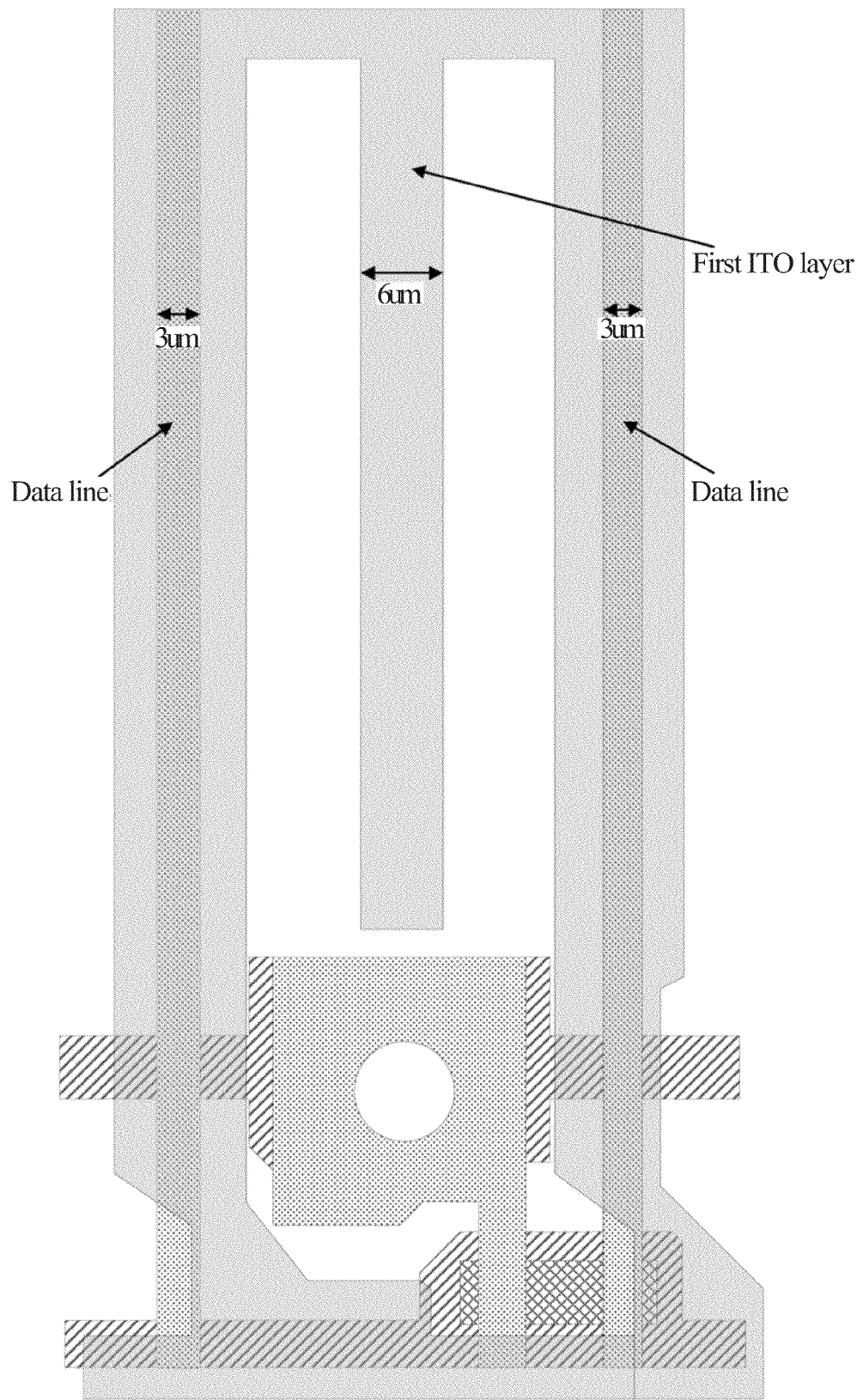
FIG. 2 is a plan view of an electrode after a first ITO layer using as a common ITO layer is exposed and developed according to an embodiment of the invention.

FIG. 2 is a plan view of an electrode after the first ITO layer is exposed and developed according to an embodiment of the invention. Because the first ITO layer is a common ITO layer, it covers a data line with a line width of 3 μm. The first ITO layer will be etched to 4 μm in line width, and in view of some etching loss, for example, 2 μm here, when the first ITO layer is etched after being exposed and developed in a practical application, then the line width of the first ITO layer is 6 μm after the first ITO layer is exposed and developed as illustrated in FIG. 2. A blank part illustrated in FIG. 2 is an exposed part after being exposed and developed, that is, the part to be etched away using oxalic acid, and the rest is the part to remain.

Figure 3:
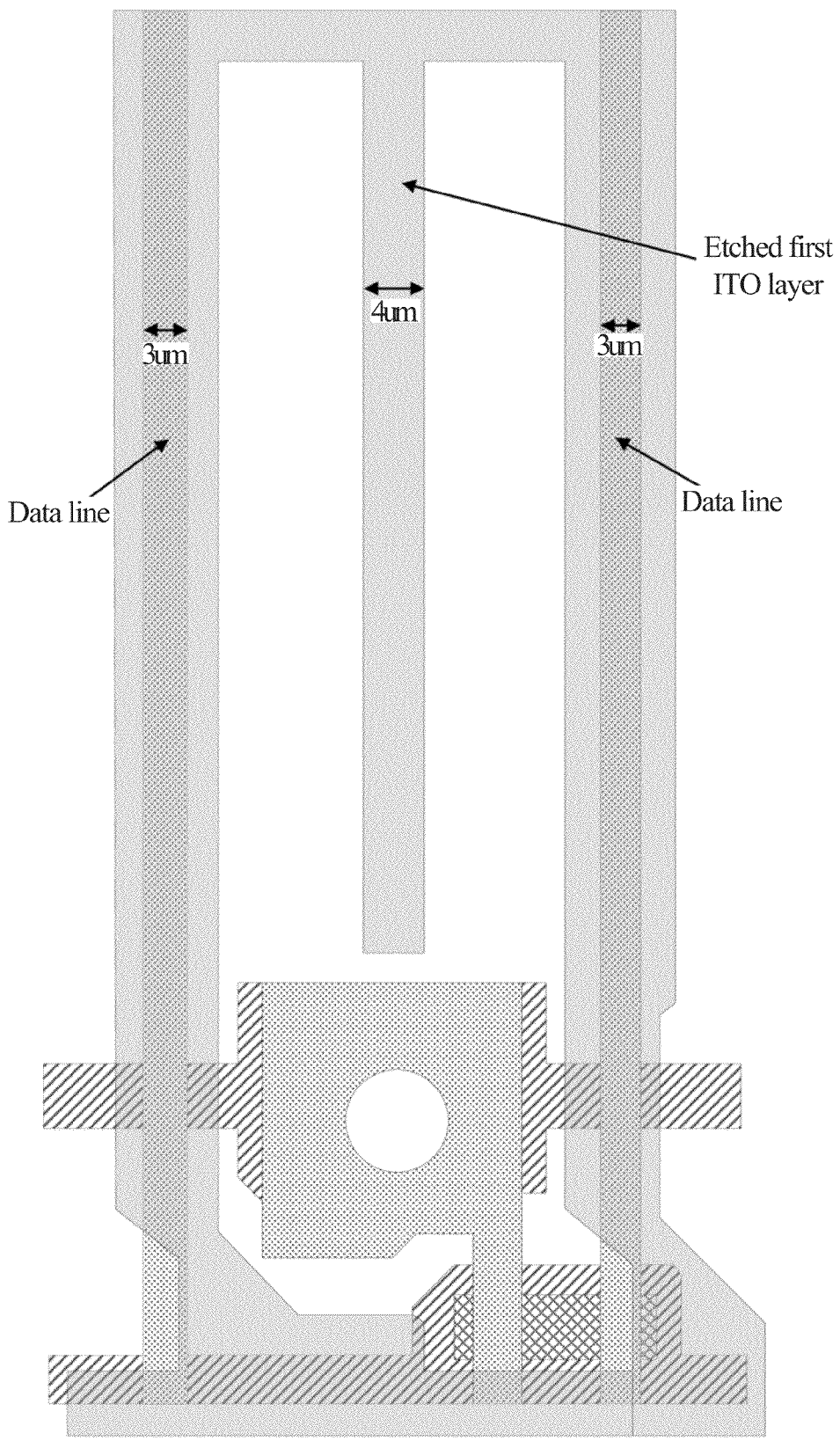
FIG. 3 is a plan view of the exposed and developed first ITO layer as illustrated in FIG. 2 after being etched according to an embodiment of the invention.

FIG. 3 is a plan view of the exposed and developed first ITO layer as illustrated in FIG. 2 after being etched according to an embodiment of the invention. As illustrated in FIG. 3, because the line width of the exposed and developed first ITO layer is 6 μm and there is an etching loss of 2 μm during etching, the line width of the etched first ITO layer in as illustrated FIG. 3 is 4 μm satisfying the standard.

After the first ITO layer is etched, then the etched first ITO layer is annealed for a first preset length of time at a temperature from 150° C. to 280° C., and then the second ITO layer is exposed and developed.

Figure 4:
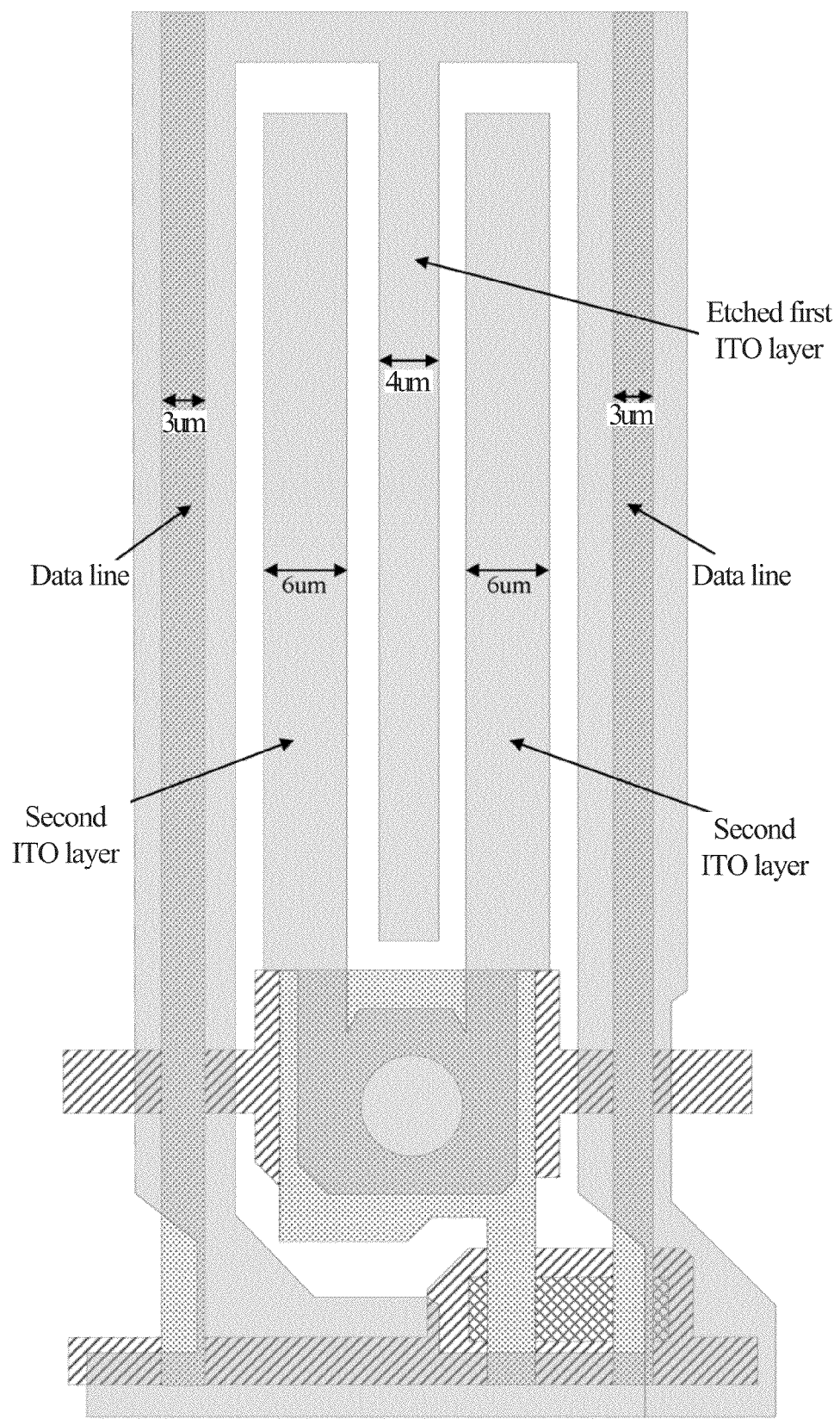
FIG. 4 is a plan view of an electrode after a second ITO layer using as a pixel ITO layer is exposed and developed according to an embodiment of the invention.

FIG. 4 is a sectional view of an electrode after the second ITO layer using as a pixel ITO layer is exposed and developed according to an embodiment of the invention, and as illustrated in FIG. 4, the second ITO layer which is a pixel ITO layer will also be etched to 4 μm in line width, so in view of an etching loss of 2 μm, the line width of the second ITO layer is also 6 μm after the second ITO layer is exposed and developed. A difference is that in FIG. 4, the part to be etched using oxalic acid may further include the part of the first ITO layer subjected to etching and the first annealing in addition to the blank part, and the rest is the part to remain.

Figure 5:
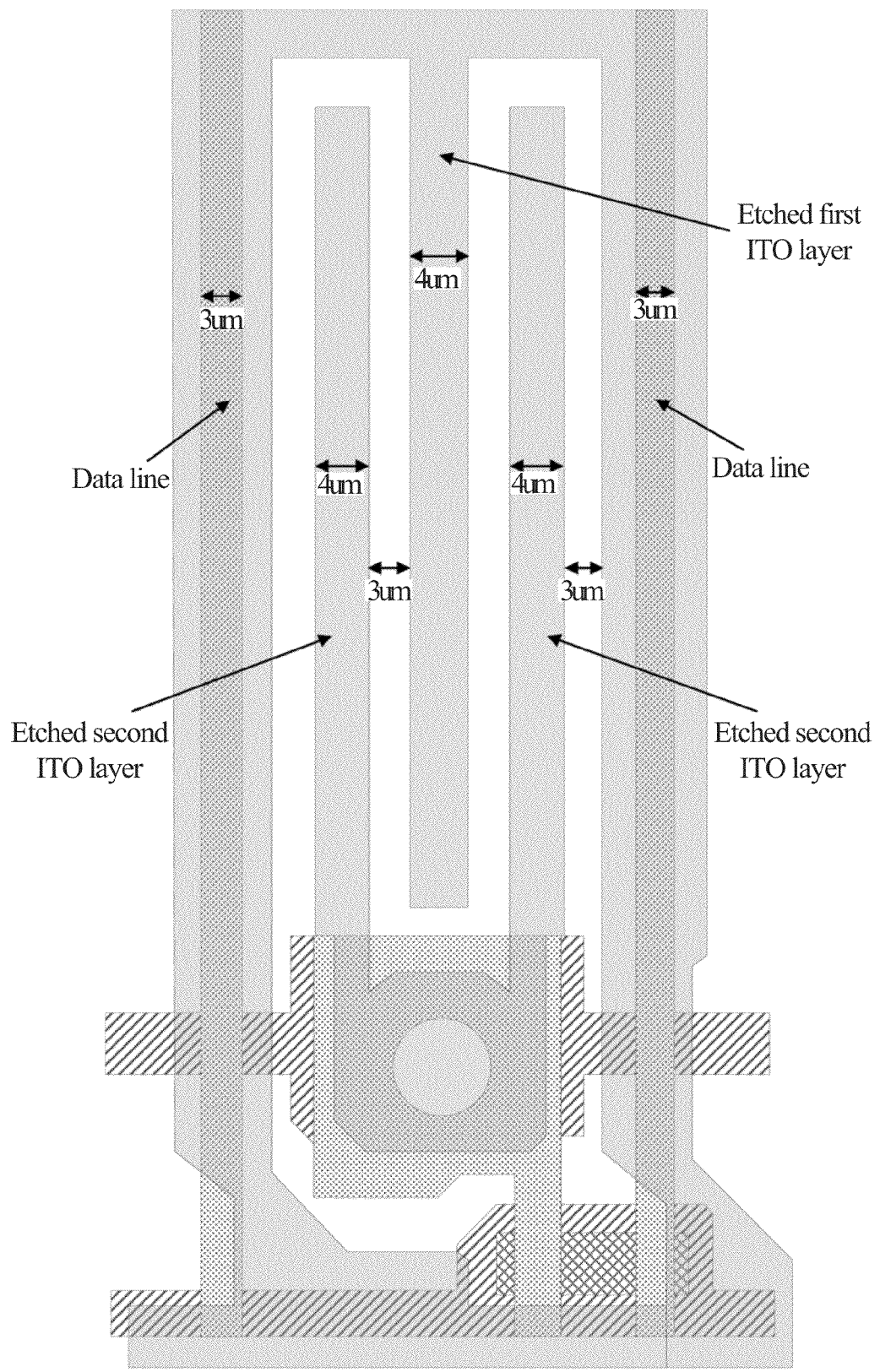
FIG. 5 is a plan view of the exposed and developed second ITO layer as illustrated in FIG. 4 after being etched according to an embodiment of the invention.

FIG. 5 is a plan view of the exposed and developed second ITO layer as illustrated in FIG. 4 after being etched according to an embodiment of the invention. As illustrated in FIG. 5, since the line width of the exposed and developed second ITO layer is 6 μm and there is an etching loss of 2 μm during etching, the line width of the etched second ITO layer as illustrated in FIG. 5 is 4 μm, satisfying the standard. Particularly since the first annealing has been performed on the etched first ITO layer before the second ITO layer is etched, when the part of the first ITO layer subjected to the first annealing as illustrated in FIG. 4 is etched using oxalic acid, the first ITO layer will not be etched away. There is a spacing of 3 μm between the etched first ITO layer and the etched second ITO layer.

It shall be noted that if the first ITO layer and the second ITO layer are fabricated concurrently using the method in the prior art, then in view of an etching loss of 2 μm and also in order to ensure a spacing of 3 μm between the two ITO layers after being etched, after the first ITO layer and the second ITO layer are exposed and developed concurrently, both the first ITO layer and the second ITO layer are 6 μm in line width, and there is a spacing of only 1 μm between the first ITO layer and the second ITO layer, which is almost undistinguishable by an exposure machine due to a limited resolution of the exposure machine. As a result, a short circuit may easily occur between the two ITO layers during etching. With the foregoing method according to the embodiments of the invention, the two ITO layers are fabricated in separate steps, where firstly the exposed and developed first ITO layer as illustrated in FIG. 2 is etched to have the blank part as illustrated in FIG. 2 etched away, and then the exposed and developed second ITO layer as illustrated in FIG. 4 is etched. Particularly the blank part as illustrated in FIG. 4 and the part of the annealed first ITO layer are etched (the part of the annealed first ITO layer will not be etched away), thus avoiding the problem of a short circuit between the two ITO layers due to a limited resolution of the exposure machine.

Those skilled in the art may also select lengths of time and temperatures for both annealing as required in practice. The temperature and the lengths of time given in the embodiments of the invention are merely experiment data. In light of the teaching of the embodiments of the invention, other temperature and the lengths of time that can be derived experimentally by those skilled in the art to ensure that the first ITO layer and the second ITO layer will differ in resistivity and transmittance from each other by no more than 5% shall come into the scope of the invention.

Various embodiments of the invention have the following advantages or advantageous effects:

The first ITO layer and the second ITO layer are etched separately in two steps, the second etching will have no influence upon the initially formed ITO layer, and the lengths of time and the temperatures of both annealing are controlled effectively, thus making it possible to effectively control the line widths of the ITO layers and the spacing between the respective ITO layers while ensuring the differences in important parameters between the two ITO layers not to be significant to thereby avoid the problem of a short circuit due to a too small spacing between the ITO layers.

The foregoing implementations will not limit the scope of the invention, and any modifications, equivalent substitutions, adaptations, etc., made without departing from the spirit and principle of the foregoing implementations shall come into the scope of the invention.

Those skilled in the art can make various modifications and variations to the invention without departing from the spirit and scope of the invention. Thus the invention is also intended to encompass these modifications and variations thereto.

What is claimed is:

1. A method of fabricating an In-Plane Switching (IPS) screen electrode, comprising:
    etching a first Indium Tin Oxide (ITO) layer using oxalic acid;
    annealing the etched first ITO layer for a first preset length of time at a temperature between 150 C and 280 C;
    etching a second ITO layer using oxalic acid; and
    annealing the etched first ITO layer and the etched second ITO layer for a second preset length of time at a temperature between 150 C and 280 C,
    wherein the first ITO layer and the second ITO layer are in the same plane.

2. The method according to claim 1, wherein the sum of the first preset length of time and the second preset length of time does not exceed 4 hours.

3. The method according to claim 2, wherein both the etched first ITO layer and the etched second ITO layer are 4 μm in line width.

4. The method according to claim 3, wherein there is a spacing of 3 μm between the etched first ITO layer and the etched second ITO layer.

5. The method according to claim 1, further comprising: before the first ITO layer is etched, the method further comprises:
    before the first ITO layer is etched, exposing and developing a resist on the first ITO layer; and
    before the second ITO layer is etched, exposing and developing a resist on the second ITO layer.

6. The method according to claim 5, wherein both the etched first ITO layer and the etched second ITO layer are 4 μm in line width.

7. The method according to claim 6, wherein there is a spacing of 3 μm between the etched first ITO layer and the etched second ITO layer.

8. The method according to claim 1, wherein the first ITO layer is a pixel ITO layer, and the second ITO layer is a common ITO layer.

9. The method according to claim 8, wherein both the etched first ITO layer and the etched second ITO layer are 4 μm in line width.

10. The method according to claim 9, wherein there is a spacing of 3 μm between the etched first ITO layer and the etched second ITO layer.

11. The method according to claim 1, wherein the first ITO layer is a common ITO layer, and the second ITO layer is a pixel ITO layer.

12. The method according to claim 1, wherein both the etched first ITO layer and the etched second ITO layer are 4 μm in line width.

13. The method according to claim 12, wherein there is a spacing of 3 μm between the etched first ITO layer and the etched second ITO layer.

* * * * *